(12) United States Patent
Miyamoto

(10) Patent No.: US 6,527,101 B1
(45) Date of Patent: Mar. 4, 2003

(54) ATTITUDE CHANGING DEVICE FOR ELECTRONIC CHIPS

(75) Inventor: Masayuki Miyamoto, Kyoto (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/386,854

(22) Filed: Aug. 13, 1999

(30) Foreign Application Priority Data

Sep. 1, 1998 (JP) .......................................... 10-246643

(51) Int. Cl.⁷ .............................................. B65G 47/24
(52) U.S. Cl. ............................ 198/397.04; 198/397.05; 198/400; 198/410; 198/416
(58) Field of Search ..................... 198/397.04, 397.05, 198/400, 410, 416, 471.1

(56) References Cited

U.S. PATENT DOCUMENTS

| | | | |
|---|---|---|---|
| 4,231,462 A | * 11/1980 | Ackley, Sr. et al. | .... 198/397.04 |
| 4,335,810 A | * 6/1982 | Ackley et al. | ......... 198/397.04 |
| 4,353,456 A | * 10/1982 | Yamamoto | ............. 198/397.04 |
| 4,437,559 A | * 3/1984 | Ackley, Sr. et al. | .... 198/397.04 |
| 4,479,573 A | * 10/1984 | Ackley, Sr. et al. | .... 198/397.04 |
| 4,648,501 A | * 3/1987 | Grant | .................... 198/397.04 |
| 4,657,130 A | * 4/1987 | Ackley, Jr. et al. | ..... 198/397.04 |
| 4,708,233 A | 11/1987 | Nomura | |
| 4,741,428 A | * 5/1988 | Taniguchi et al. | ...... 198/397.04 |

FOREIGN PATENT DOCUMENTS

| | | |
|---|---|---|
| DE | 33 42 899 | 6/1985 |
| JP | 7-149422 | 6/1995 |
| JP | 7-157071 | 6/1995 |
| JP | 10059537 A | 3/1998 |
| JP | 11208869 A | 8/1999 |
| WO | 81/01133 | 4/1981 |

* cited by examiner

Primary Examiner—Douglas Hess
(74) Attorney, Agent, or Firm—Burns, Doane, Swecker & Mathis, LLP

(57) ABSTRACT

An electronic chip attitude changing device includes a rotor having, on the outer periphery, cavities that are formed at equal pitch to respectively contain and hold electronic chips with a part thereof projecting out; an air suction path for drawing and holding the electronic chips in the cavities of the rotor; a driving device for rotationally driving the rotor in a predetermined direction; and a chip guide placed at a fixed position close to the outer periphery of the rotor and having a guide face for making sliding contact with the projecting portions of the electronic chips held in the cavities so as to turn the attitudes of the electronic chips by 90°.

26 Claims, 6 Drawing Sheets

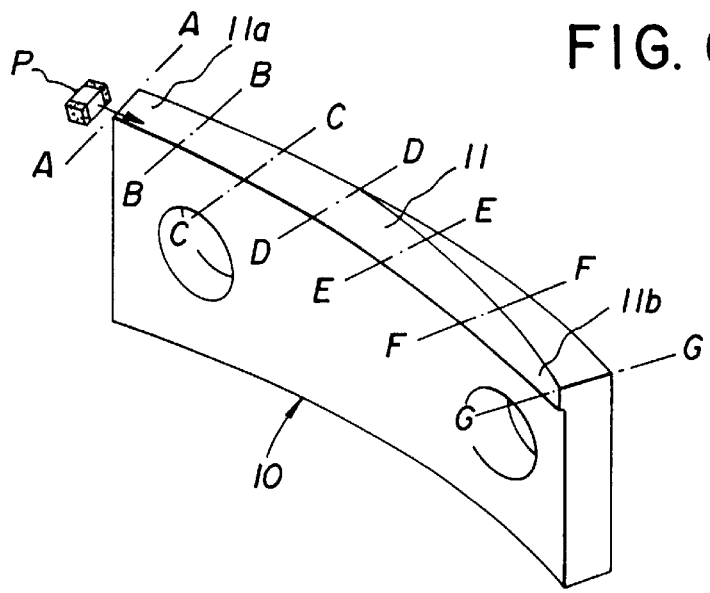
FIG. 6
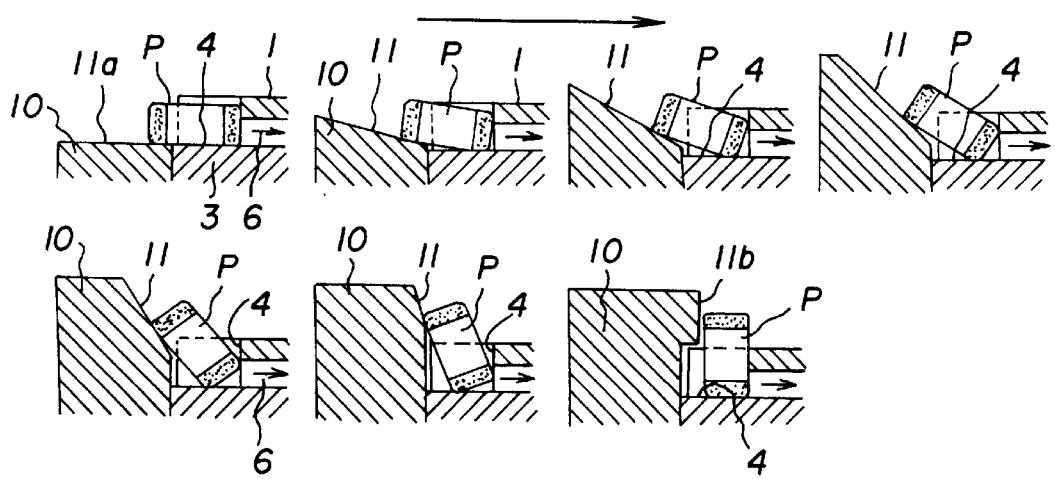
FIG. 7A  FIG. 7B  FIG. 7C  FIG. 7D
PROCESS OF TURN
FIG. 7E  FIG. 7F  FIG. 7G

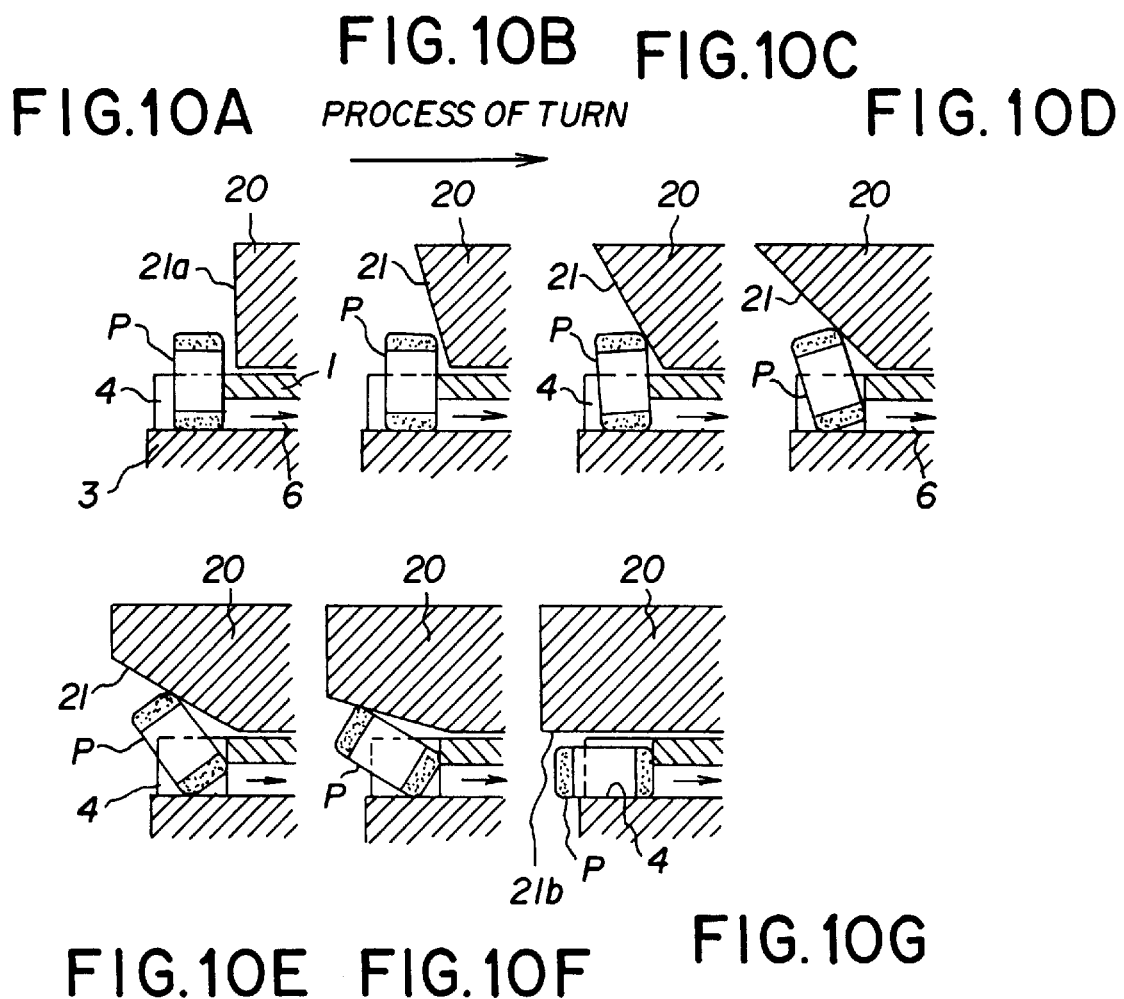

ATTITUDE CHANGING DEVICE FOR ELECTRONIC CHIPS

Priority is claimed under 35 U.S.C. §119 to Japanese Patent Application No. 10-246643 filed in Japan on Sep. 1, 1998, the entire content of which is hereby incorporated by reference.

BACKGROUND OF THE INVENTION

1. Field of the Invention

The present invention relates to a device for changing the attitudes of chips parts, such as electronic chips, by 90° while feeding the electronic chips onto a rotor one by one.

2. Description of the Related Art

Japanese Unexamined Patent Publication No. 7-157071 discloses a conventional feeding device in which electronic chips are transferred from a parts feeder into a recess formed on the outer periphery of a rotor. The electronic chips are subjected to measurement or the like while being held in the recesses and rotated intermittently. The electronic chips are then transferred from the rotor onto a carrier tape and are loaded therein.

In such a feeding device, since electric characteristics of the electronic chips are measured while the chip parts are being conveyed by the rotor, the electronic chips are placed in the recesses of the rotor in a horizontal position. Measurements are taken by putting measuring terminals into contact with two electrodes of each electronic chip.

FIG. 1 shows an example of such a measuring method, in which P denotes an electronic chip, P1 and P2 denote electrodes, and T1 and T2 denote measuring terminals. Measuring terminals T1 and T2 are arranged in parallel. In such a measuring method a large stray capacitance is produced between the two measuring terminals T1 and T2 which causes errors in measured values.

In order to reduce such errors, it is preferable to take measurements with the measuring terminals T1 and T2 held to both ends of the electronic chip P, as shown in FIG. 2. For this purpose, it is necessary to change the attitude of the electronic chip P in the recess of the rotor from a horizontal position to a vertical position.

Such an attitude changing device is known in which a electronic chip is made vertical by thrusting a pin and by air suction, as is disclosed in Japanese Unexamined Patent Publication No. 7-149422. In this device, however, the electronic chip is liable to be damaged because the thrusting force of the pin acts directly on the electronic chip. Furthermore, since the rotor must be stopped every time the pin is thrust, it is difficult to use this device in a rotor that rotates at high speed. In addition, since high positioning accuracy is needed, the costs of the device increases.

SUMMARY OF THE INVENTION

Accordingly, an object of the present invention is to provide an electronic chip attitude changing device that does not significantly damage electronic chips, that is applicable to a rotor which rotates at high speed, and that provides a simple structure at a low cost.

In order to achieve the above objects, according to an aspect of the present invention, an attitude changing apparatus is provided for changing the attitude of an electronic chip, the apparatus includes a rotor including cavities on the outer periphery of the rotor, the cavities contain and hold electronic chips, wherein a part of the electronic chips projects over an outside portion of the rotor; an air suction path for drawing and holding the electronic chips in the cavities of the rotor; driving means for rotationally driving the rotor in a predetermined direction; and a chip guide placed at a fixed position close to the outer periphery of the rotor, the chip guide includes a guide face for making sliding contact with the projecting portions of the electronic chips held in the cavities so as to turn the attitudes of the electronic chips by 90°.

The chip guide is arranged to face the outer peripheral surface of the rotor, wherein the guide face has an arc guide surface with a first end substantially in the plane of the rotor cavities and a second end substantially perpendicular to the plane of the rotor cavities, the arc guide surface gradually twists between the first end and the second end, and projecting portions of the electronic chips that project toward the outer peripheral surface of the rotor contact the guide face from a loading end of the rotation of the rotor toward a removal end of the rotation of the rotor, whereby the attitudes of the electronic chips are changed from a horizontal position to a vertical position.

The above objects are also achieved, according to another aspect of the present invention by a method for changing the attitude of an electronic chip, by placing an electronic chip in cavities of a rotor, the cavities located on the outer periphery of the rotor, wherein a part of the electronic chips projects over an outside portion of the rotor; by drawing and holding the electronic chips in the cavities of the rotor using an air suction path; by driving the rotor in a predetermined direction; and by making sliding contact to turn the attitudes of the electronic chips by 90°, by a chip guide placed at a fixed position close to the outer periphery of the rotor, the chip guide including a guide face for making the sliding contact with the projecting portions of the electronic chips held in the cavities.

The above objects are further achieved according to a further aspect of the present invention by an electronic chip feeding apparatus for changing the attitude of the electronic chip including a loading section for loading electronic chips onto a rotor in a first position; a first attitude changing section for slidably changing the position of the electronic chip by 90° to a second position, the electronic chip slidably changing from the first position to the second position with the rotation of the rotor; a working section; and a removal section for removing the electronic chips from the rotor.

The projecting portion of the electronic chip held in the cavity of the rotor makes contact with the guide face of the chip guide in conjunction with the rotation of the rotor. Then, the electronic chip starts to turn to a vertical position by the air sucking portion with the rotation of the rotor, and is stably placed in a position turned by 90°. In this way, since the electronic chip gradually changes its attitude, the impulsive force that is produced by thrusting of the pin does not act, and the electronic chip suffers little damage. In particular, since the air suction path is connected to the cavity that holds the electronic chip therein, the electronic chip is prevented from popping out of, and falling out of the cavity at the time of attitude change, which achieves stable attitude change.

According to one aspect of the present invention the guide face of the chip guide is formed of a smooth and continuous surface in order to reduce friction between the guide face and the electronic chip. Moreover, according to another aspect of the present invention in order to minimize damage to the electronic chip, the guide face is shaped so as not to contact the electronic chip at the edge such that the edge is in face contact with the electronic chip.

In contrast to the pin thrust method, according to the present invention the attitude of the electronic chip is gradually changed with the rotation of the rotor. Therefore, the rotor need not be rotated intermittently, but may be rotated continuously. Accordingly, it is possible to increase the rotation speed of the rotor, and to further improve the throughput in changing the attitude. Furthermore, since a high-precision positioning mechanism is unnecessary, the device is simplified and the cost thereof is low.

The attitude changing device of the present invention is applicable not only to a case in which an electronic chip in a horizontal position is turned to a vertical position, but also to a case in which an electronic chip in a vertical position is turned to a horizontal position. That is, it is possible for the chip guide to be placed to face the outer peripheral top surface of the rotor, for the guide face of the chip guide to be vertical at the loading end rotation of the rotor such that it is in parallel with the inner side faces of the cavities, the guide face of the chip guide is horizontal at the removal end of the rotation of the rotor so as to face the bottom faces of the cavities, and to continuously change from the loading end to the removal end of the rotation of the rotor, and for the projecting portions of the electronic chips that project toward the outer peripheral top face of the rotor to make contact with the guide face from the loading end toward the removal end with the rotation of the rotor, whereby the attitudes of the electronic chips are changed from a vertical position to a horizontal position.

Further objects, features, and advantages of the present invention will become apparent from the following description of the preferred embodiment with reference to the attached drawings.

BRIEF DESCRIPTION OF THE DRAWINGS

FIG. 6 is a perspective view of a first chip guide.

FIG. 7 is a plurality of diagrams illustrating an operation of changing the attitude of an electronic chip by using the first chip guide.

FIG. 10 is a plurality of diagrams illustrating an operation of changing the attitude of an electronic chip by using the second chip guide.

DESCRIPTION OF THE PREFERRED EMBODIMENT

FIGS. 3 to 10 show a parts supply device according to an embodiment of the present invention.

Figure 4:
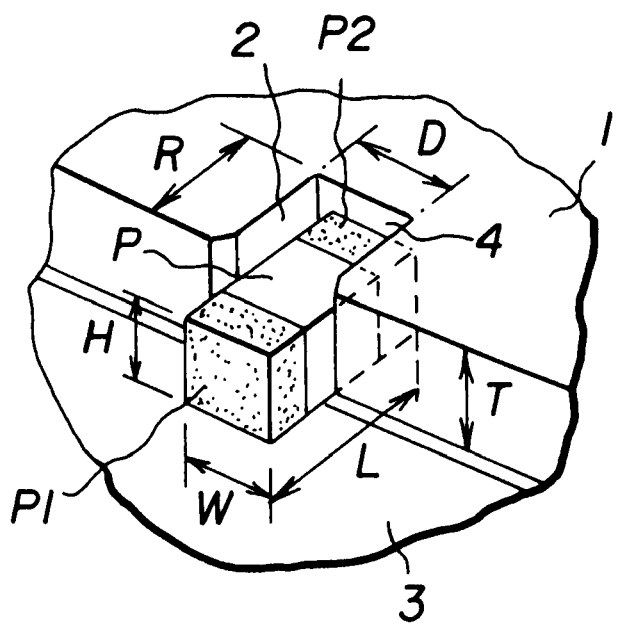
FIG. 4 is a perspective view showing an electronic chip of the part supply device shown in FIG. 3.

As illustrated in FIG. 4, according to an exemplary embodiment of the present invention an electronic chip P is shaped like a rectangular parallelepiped and has a height H and a width W (H~W), and a length L (L>H, L>W). The electronic chip P is provided with electrodes P1 and P2 at both lengthwise ends.

Figure 3:
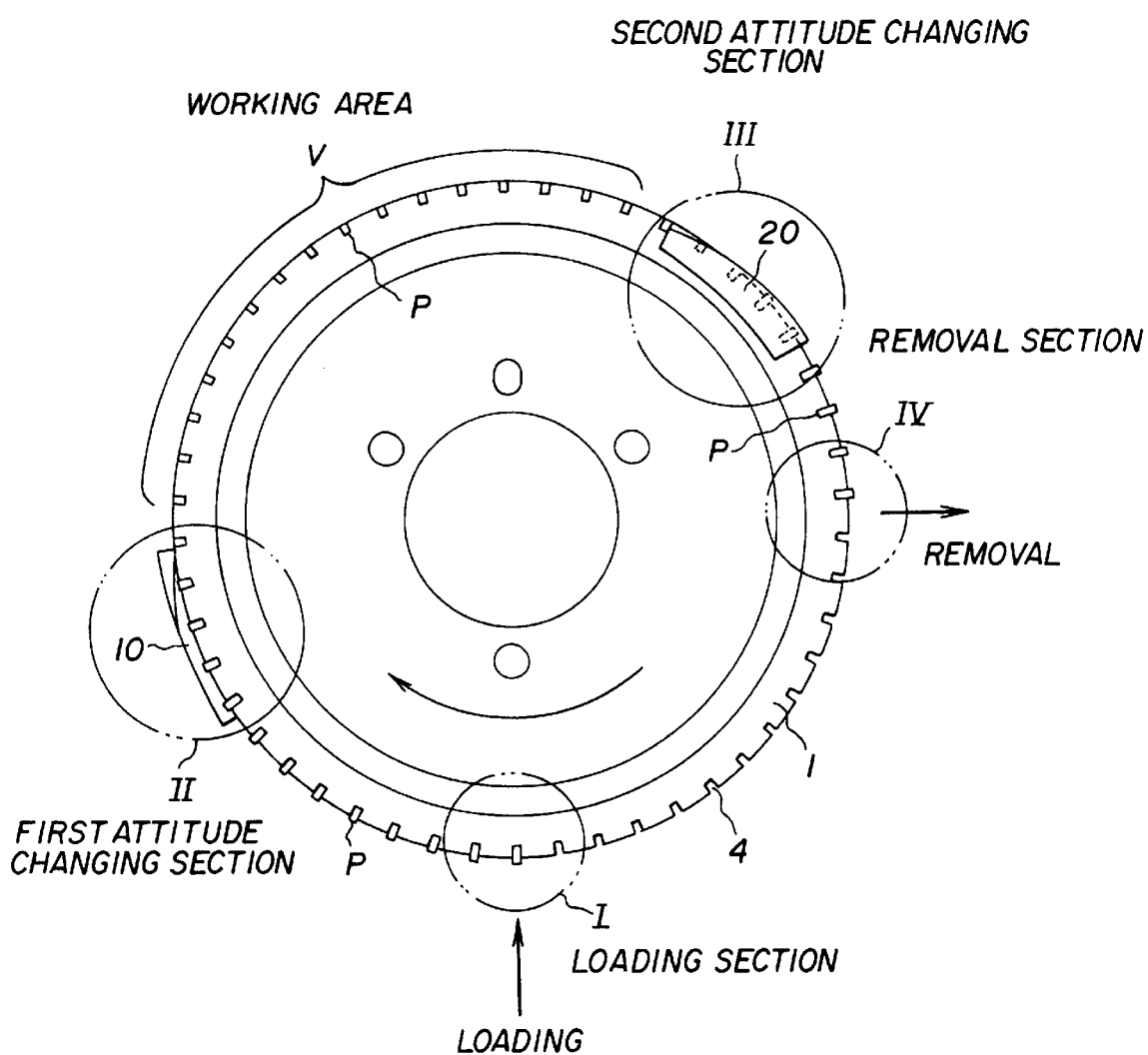
FIG. 3 is a plan view of an electronic chip supply device equipped with an attitude changing device according to an embodiment of the present invention.

As illustrated in FIG. 3, the parts supply device has a rotor 1 around which a loading section I, a first attitude changing section II, a second attitude changing section III, and a removal section IV are provided. Between the first attitude changing section II and the second attitude changing section III, a working area V is provided for making characteristics measurements or the like.

Figure 5:
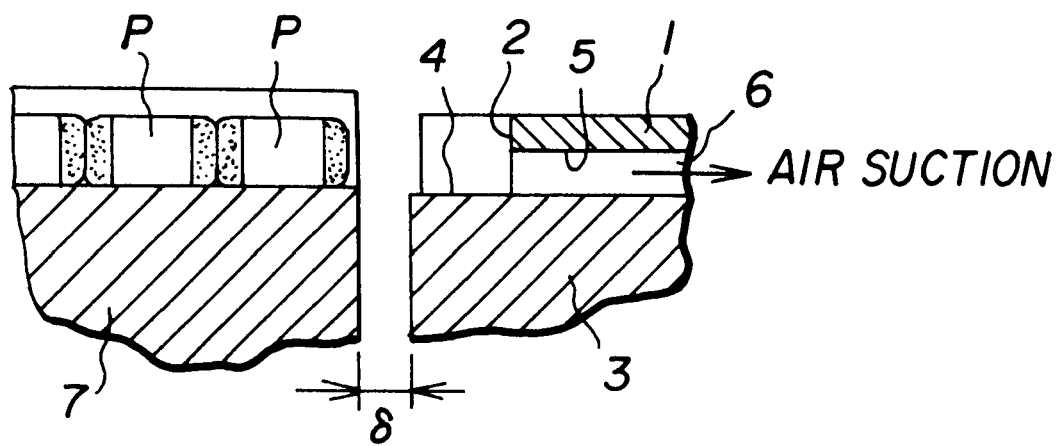
FIG. 5 is a sectional view of a loading section of the electronic chip supply device shown in FIG. 3.

The rotor 1 is rotationally driven in the direction of the arrow from the loading section to the removal section by a driving device (not shown) such as a motor. In the following description when reference is made to the loading end or the removal end of the rotation of the rotor, one skilled in the art will recognize that these terms are relative terms used to described which directional end of the rotor is being referred to and not that the elements described are located in the loading section I and the removal section IV. As illustrated in FIG. 5, the rotation may be made continuously or intermittently. In this embodiment, the rotor 1 is formed by a disklike member having recesses 2 formed at equal pitch on the outer periphery thereof. The lower surface of the rotor 1 is supported by a disklike base 3 placed at a fixed position. Accordingly, the inner surfaces of the recesses 2 of the rotor 1 and the upper surface of the base 3 form cavities 4 at equal pitch, which are opened toward the outer periphery. Furthermore, grooves 5 extending in the radial direction are formed on the lower surface of the rotor 1 so as to communicate with the recesses 2. Between the grooves 5 and the upper surface of the base 3, air suction paths 6 are formed to draw and hold electronic chips P inside the cavities 4.

Referring now to FIG. 4, the size R of the cavity 4 (recess 2) in the radial direction is less than the length L of an electronic chip P, and is greater than the height H and width W thereof. The depth T of the cavity 4 (the thickness of the rotor 1) and the width D of the cavity 4 in the rotational direction are also less than the length L and are greater than the height H and width W of the electronic chip P as illustrated by equations (1)–(3) below:

$$H, W<R<L \tag{1}$$

$$H, W<T<L \tag{2}$$

$$H, W<D<L \tag{3}$$

In order to maintain the stability of the electronic chip P inside the cavity 4, according to an exemplary embodiment of the present invention a length of a part of the electronic chip P projecting from the cavity 4 (L-R, L-T) should be equal to or less than half the length L of the electronic chip P in accordance with equations (4) and (5) below:

$$L-R \leq L/2 \tag{4}$$

$$L-T \leq L/2 \tag{5}$$

Electronic chips P are inserted into the loading section I in a horizontal position, as shown in FIG. 5. The electronic chips P, which have been conveyed in a horizontal position by a feeding device, such as a linear feeder 7, are each drawn into the cavity 4 by air suction through the air suction path 6. Referring again to FIG. 4, since the size R of the cavity 4 in the radial direction is less than the length L of the electronic chip P and is greater than the height H and the width W thereof, when the electronic chip P is inserted in the cavity 4 in a horizontal position, it partly projects from the cavity 4. For this reason, referring now to FIG. 5, a clearance δ that is greater than the projection length of the electronic chip P is formed between the linear feeder 7 and the rotor 1 (or the base 3).

When the electronic chip P reaches the first attitude changing section II with the rotation of the rotor 1, it makes contact with a first chip guide 10 shown in FIG. 6. The first chip guide 10 is fixed to a fixed portion, e.g., the outer peripheral surface of the base 3, and is placed close to the outer peripheral surface of the rotor 1. At the top end of the first chip guide 10, a smooth guide face 11, with a guide surface in formed in an arc shape and makes sliding contact with the projecting portion of the electronic chip P held in the cavity 4 so as to turn the electronic chip P by 90° from a horizontal position to a vertical position. The guide face 11 has a horizontal face 11a at the loading end of the rotation of the rotor, and continuously changes so that it has a vertical face 11b at the removal end of the rotation of the rotor. In other words, at the loading end of the rotation of the rotor the guide face 11 is substantially in the plane, e.g., within a few degrees, of the rotor cavities 4 and at the removal end of the rotation of the rotor the guide face 11 is substantially perpendicular, e.g., within a few degrees, to the plane of the rotor cavities.

FIG. 7 includes explanatory diagrams showing the contact positions A to G of the electronic chip P with the guide face 11, and the changes in attitude of the electronic chip P. At the position A of FIG. 6, the electronic chip P is in a horizontal position. As the electronic chip P moves to B, C, D, E, and F in this order, it gradually changes its attitude to a vertical position, so that it is placed in the vertical position at the position G. Since the electronic chip P and the guide face 11 are approximately in face contact with each other during this, damage to the electronic chip is small. Furthermore, since air is sucked from the air suction path 6 while the electronic chip P is changing its attitude, the electronic chip P slowly turns on the sucking portion in conjunction with rotation of the rotor 1. This makes it possible to prevent the electronic chip P from popping inside the cavity 4 and from falling off.

Figure 1:
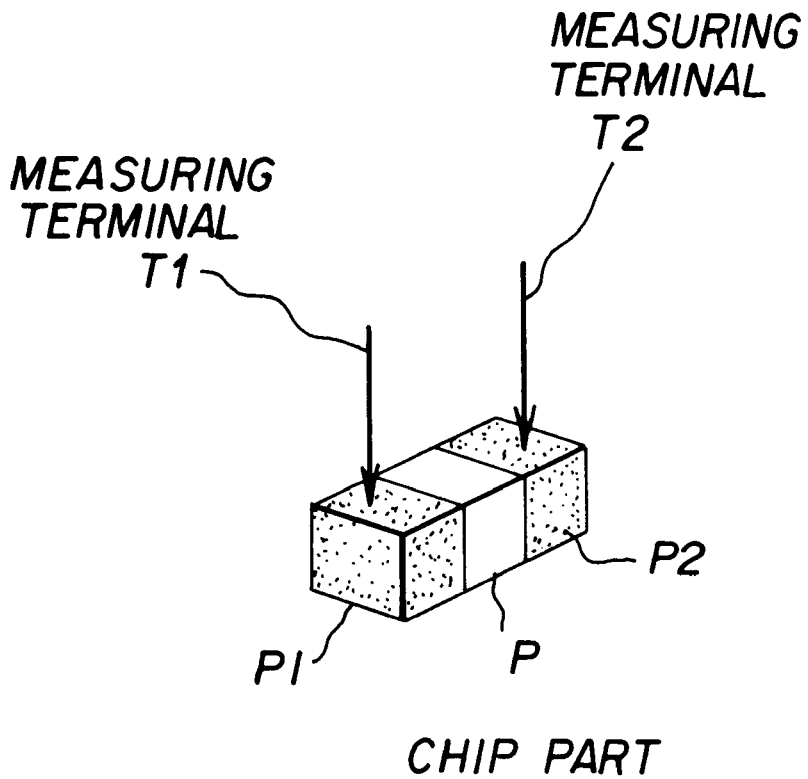
FIG. 1 is a perspective view illustrating an example of an electronic chip measuring method.
Figure 2:
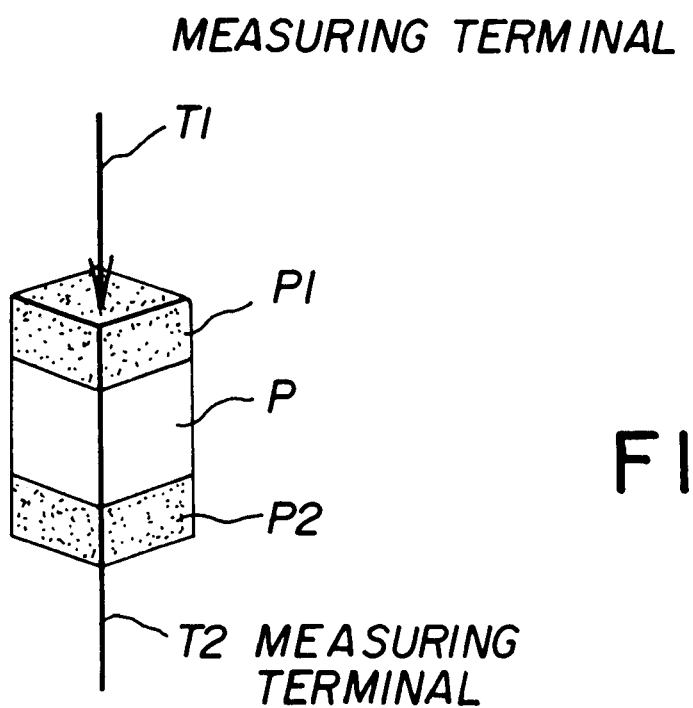
FIG. 2 is a perspective view illustrating another example of an electronic chip measuring method.
Figure 8:
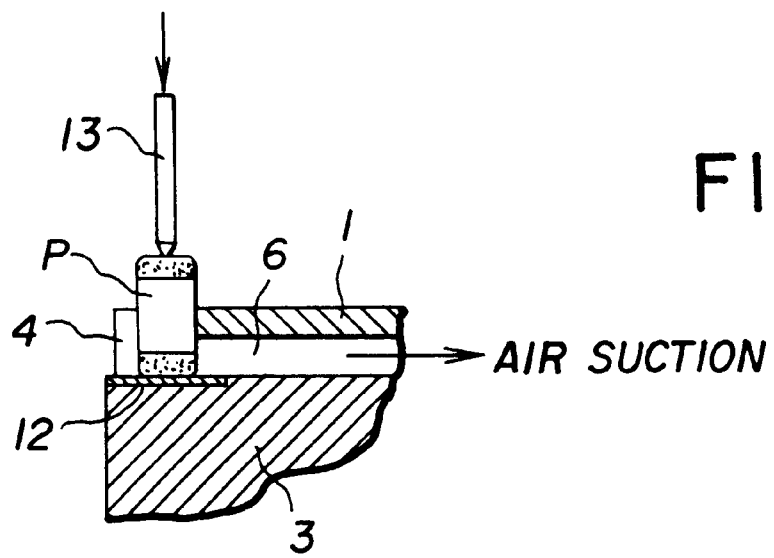
FIG. 8 is a sectional view of the part supply device shown in FIG. 3, taken at a measuring area.

In the working area V, the electronic chip P is conveyed in a vertical position, and the electric characteristics thereof are measured. As shown in FIG. 8, a plurality of measuring terminals 12 are patterned on the upper surface of the based 3 in the measurement area V, and a measuring terminal 13 is placed above electronic chip P. When the electronic chip P held in the cavity 4 is conveyed onto the measuring terminal 12, the measuring terminal 13 is moved down into pressure contact with the upper end face of the electronic chip P. As a result, the electronic chip P is clamped at both end faces by the measuring terminals 12 and 13, which allows errorless measurement, as described with reference to FIG. 2.

Although FIG. 8 illustrates an exemplary embodiment in which the measuring terminals 12 are patterned on the upper surface of the base 3, a pin-shaped measuring terminal which is thrust from the lower side of the base 3 so as to face the measuring terminal 13 may be used instead.

Figure 9:
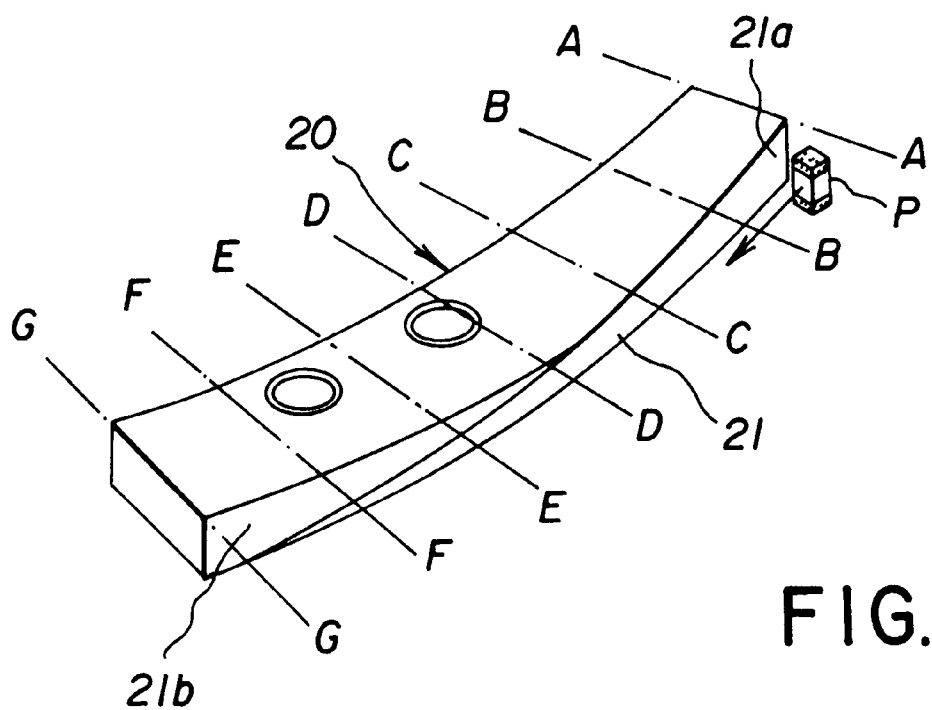
FIG. 9 is a perspective view of a second chip guide.

When the electronic chip P reaches the second attitude changing section II with the rotation of the rotor 1, it makes contact with a second chip guide 20 shown in FIG. 9. The second chip guide 20 is fixed to a fixed portion, e.g., the outer peripheral surface of the base 3, via a fitting (not shown), and is placed close to the upper surface on the outer periphery of the rotor 1. On the outer peripheral surface of the second chip guide 20, a guide face 21 is formed that makes sliding contact with the projecting portion of the electronic chip P held in the cavity 4 so as to turn the attitude of the electronic chip P by 90° from a vertical position to a horizontal position. The guide face 21 has a vertical face 21a at the loading end of the rotation of the rotor, and continuously changes so that it has a horizontal face 21b at the removal end of the rotation of the rotor.

FIG. 10 includes explanatory diagrams illustrating the contact positions A to G of the electronic chip P with the guide face 21 and the changes in attitude of the electronic chip P. When the electronic chip P is at the position A in FIG. 9, it is in a vertical position. As the electronic chip P moves to B, C, D, E, and F in that order, it gradually changes its attitude to a horizontal position, so that it is placed in a horizontal position at the position G. Since the electronic chip P and the guide face 21 are approximately in face contact with each other during this, damage to the electronic chip P is minimal. Furthermore, since air is sucked from the air suction path 6 while the electronic chip P is changing its attitude, the electronic chip P is prevented from popping inside the cavity 4 and from falling off.

In the removal section IV, the electronic chip P is conveyed in a horizontal position and is taken out of the cavity 4 by jetting air from the air suction path 6. It is not always necessary to provide the removal section IV at one position, and products that are judged to be good by characteristics measurements, and products that are judged to be defective, may be taken out at separate removal positions. Furthermore, a carrier tape may be placed close to the takeoff section IV so that the products judged to be good can be taped unchanged.

According to the present invention, since the attitudes of the electronic chips P can be continuously changed while rotating the rotor 1, the feeding speed of the electronic chips P is not decreased. For this reason, it is possible to achieve attitude change with a throughput of 2000 parts per minute or more, which has been impossible hitherto.

While the present invention has been described with reference to what is presently considered to be the preferred embodiment, it is to be understood that the invention is not limited to the disclosed embodiment.

While the chip guides 10 and 20 in the form of a thick plate are partly worked into the guide faces 11 and 21, respectively, in the above exemplary embodiment, a chip guide may be formed by bending a metal plate having a smooth surface into the shape of a guide face.

Although the cavities 4 are formed by supporting the lower surface of the rotor 1, which has the recesses 2 formed at equal pitch on the outer periphery, by the base 3 in the above embodiment, pocket-shaped cavities may be formed on the outer periphery of the rotor. In this case, a chip part in the cavity does not slide with respect to the bottom face of the cavity in conjunction with the rotation of the rotor.

Although electronic chips are taken from the linear feeder 7 into the rotor at the loading section I in the description of the above exemplary embodiment, a separate supply rotor having the same peripheral velocity may be provided close to the rotor so that electronic chips are transferred from the supply rotor to the rotor of the present invention. In this case, the rotor can be rotated not only intermittently, but also continuously.

While the working area V between the first attitude changing section II and the second attitude changing section III is used for measurement of electric characteristics in the above embodiment, it may be used for other operations, e.g., visual inspection and labeling.

It is not always necessary to provide the two attitude changing sections II and III for a single rotor, and only one of them may be provided. For example, an electronic chip may be taken into the cavity in a horizontal position, be turned into a vertical position, and then be taken unchanged. Conversely, an electronic chip may be taken into the cavity in a vertical position, be turned into a horizontal position, and then taken out unchanged.

While the electronic chips shaped like a rectangular parallelepiped have been described in the above exemplary embodiment, the electronic chips may have other shapes, such as a cube, a cylinder, or a disk. It is only necessary to change the shape of the cavities in accordance with the shape of the electronic chips.

As described above, according to exemplary embodiments of the present invention, an electronic chip is contained and held in the cavity of the rotor with a part thereof projecting out, and the projecting portion of the electronic chip makes sliding contact with the guide face of the chip guide while rotating the rotor, thereby turning the attitude of the electronic chip by 90°. This does not significantly damage the electronic chip, and is applicable to a rotor that rotates at high speed. Furthermore, since the attitude can be changed merely by placing the chip guide at a predetermined position, the device is simplified and constructed at low cost, compared with the conventional method in which the attitude is changed by raising the electronic chip by the pin.

In addition, since the electronic chip is held in the cavity by being drawn through the air suction path during the attitude change, it is possible to prevent the electronic chip from popping inside the cavity and from falling off, and to thereby achieve stable attitude change.

Many different embodiments of the present invention may be constructed without departing from the spirit and scope of the present invention. It should be understood that the present invention is not limited to the specific embodiments described in the specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. An attitude changing apparatus for changing the attitude of an electronic chip, the apparatus comprising:
    a rotor including cavities on the outer periphery of the rotor, the cavities contain and hold electronic chips, wherein a part of the electronic chips projects over an outside portion of the rotor;
    a base supporting the rotor;
    driving means for rotationally driving the rotor in a predetermined direction; and
    a chip guide placed at a fixed position close to the outer periphery of the rotor, the chip guide includes a continuously twisted guide face for making sliding contact with the projecting portions of the electronic chips held in the cavities so as to turn the attitudes of the electronic chips by 90°, wherein the guide face and an upper surface of the base are initially co-planar to load the electronic chips with minimal disturbance.

2. The apparatus of claim 1, wherein the chip guide is arranged to face the outer peripheral surface of the rotor, wherein the guide face has an arc guide surface with a first end substantially in the plane of the rotor cavities and a second end substantially perpendicular to the plane of the rotor cavities, the arc guide surface gradually twists between the first end and the second end, and
    wherein projecting portions of the electronic chips that project toward the outer peripheral surface of the rotor contact the guide face from a loading end of the rotation of the rotor toward a removal end of the rotation of the rotor, whereby the attitudes of the electronic chips are changed from a horizontal position to a vertical position.

3. The apparatus of claim 1, wherein the chip guide is arranged to face the outer peripheral top face of the rotor, wherein the guide face has an arc guide surface with a first end substantially perpendicular to the plane of the rotor cavities and a second end substantially in parallel to the plane of the rotor cavities, the arc guide surface gradually twists between the first end and the second end,
    wherein the projecting portions of the electronic chips that project toward the outer peripheral top face of the rotor make contact with the guide face from a loading end of the rotation of the rotor toward a removal end of the rotation of the rotor, whereby the attitudes of the electronic chips are changed from a vertical position to a horizontal position.

4. The apparatus of claim 1, wherein the cavities are formed at an equal pitch.

5. The apparatus of claim 1, wherein the guide face is formed of a smooth continuous surface.

6. A method for changing the attitude of an electronic chip, comprising the steps of:
    placing an electronic chip in cavities of a rotor which is supported by a base, the cavities located on the outer periphery of the rotor, wherein a part of the electronic chips projects over an outside portion of the rotor;
    driving the rotor in a predetermined direction; and
    making sliding contact to turn the attitudes of the electronic chips by 90°, by a chip guide placed at a fixed position close to the outer periphery of the rotor, the chip guide including a continuously twisted guide face for making the sliding contact with the projecting portions of the electronic chips held in the cavities, wherein the guide face and an upper surface of the base are initially co-planar to load the electronic chips with minimal disturbance.

7. The method of claim 6, wherein the chip guide is arranged to face the outer peripheral surface of the rotor, the method further comprising the steps of:
    positioning the guide face of the chip guide in a horizontal position at a loading end of the rotation of the rotor such that the guide face is approximately flush with the bottom faces of the cavities;
    positioning the guide face of the chip guide in a vertical position at a removal end of the rotation of the rotor such that the guide face faces the inner side faces of the cavities, and
    continuously changing the position of the guide face from the loading end to the removal end of the rotation of the rotor, and
    wherein projecting portions of the electronic chips that project toward the outer peripheral surface of the rotor contact the guide face from the loading end of the rotation of the rotor toward the removal end of the rotation of the rotor, whereby the attitudes of the electronic chips are changed from a horizontal position to a vertical position.

8. The method of claim 6, wherein the chip guide is arranged to face the outer peripheral top face of the rotor, the method further comprising the steps of:
    positioning the guide face of the chip guide a vertical position at a loading end of the rotation of the rotor such that the guide face is in parallel with the inner side faces of the cavities;

positioning the guide face of the chip guide in a horizontal position at removal end of the rotation of the rotor such that the guide face faces the bottom faces of the cavities; and continuously changing the position of the guide face from the loading end and to the removal end of the rotation of the rotor;

wherein the projecting portions of the electronic chips that project toward the outer peripheral top face of the rotor make contact with the guide face from the loading end of the rotation of the rotor toward the removal end of the rotation of the rotor, whereby the attitudes of the electronic chips are changed from a vertical position to a horizontal position.

9. The method of claim 6, wherein the guide face is formed of a smooth continuous surface.

10. An electronic chip feeding apparatus for changing the attitude of the electronic chip comprising:

a loading section for loading electronic chips onto a rotor in a first position;

a base supporting the rotor;

a first attitude changing section for slidably changing the position of the electronic chip by 90° to a second position, the electronic chip slidably changing from the first position to the second position with the rotation of the rotor via a continuously twisted guide face, wherein the guide face and an upper surface of the base are initially co-planar to load the electronic chips with minimal disturbance;

a working section; and a removal section for removing the electronic chips from the rotor.

11. The apparatus of claim 10 further comprising:

a second attitude changing section, located between the working section and the removal section, for slidably changing the position of the electronic chip by 90° to the first position with the rotation of the rotor.

12. The apparatus of claim 11, wherein the second attitude changing section comprises:

a chip guide for making sliding contact with a projecting portion of the electronic chips, the electronic chip gradually moves from a first position in which the chip guide is perpendicular to a cavity containing the electronic chip to a second position in which the chip guide is in substantially the same plane as the cavity containing the electronic chip.

13. The attitude changing apparatus of claim 12, wherein the electronic chip inside the cavity is prevented from popping outside the cavity by air suction.

14. The attitude changing apparatus of claim 10, wherein electronic measurements are performed on the electronic chips in the working section.

15. The apparatus of claim 10, wherein the electronic chips are loaded into a cavity in the rotor by air suction.

16. The apparatus of claim 10, wherein the removal section comprises:

an air suction path for removing the electronics chips from a cavity in the rotor.

17. The apparatus of claim 10, wherein the rotor is rotated continuously.

18. The apparatus of claim 10, wherein the rotor is rotated intermittently.

19. The attitude changing apparatus of claim 10, wherein the first attitude changing section comprises:

a chip guide for making sliding contact with a projecting portion of the electronic chips, the electronic chip gradually moves from a first position in which the chip guide is in substantially the same plane as a cavity containing the electronic chip to a second position in which the chip guide is perpendicular to the cavity containing the electronic chip.

20. The attitude changing apparatus of claim 19, wherein the electronic chip inside the cavity is prevented from popping outside the cavity by air suction.

21. An attitude changing apparatus for changing the attitude of an electronic chip, the apparatus comprising:

a rotor including cavities on the outer periphery of the rotor, the cavities contain and hold electronic chips horizontally, wherein a part of the electronic chips projects over an outside portion of the rotor;

a base supporting the rotor;

driving means for rotationally driving the rotor in a predetermined direction; and a chip guide placed at a fixed position close to the outer periphery of the rotor, the chip guide includes a continuously twisted guide face for making sliding contact with the projecting portions of the electronic chips held in the cavities so as to turn the attitudes of the electronic chips by 90° to vertical, wherein the guide face and an upper surface of the base are initially co-planar to load the electronic chips.

22. A method for changing the attitude of an electronic chip, comprising the steps of:

placing an electronic chip horizontally in cavities of a rotor which is supported by a base, the cavities located on the outer periphery of the rotor, wherein a part of the electronic chips projects over an outside portion of the rotor;

driving the rotor in a predetermined direction; and making sliding contact to turn the attitudes of the electronic chips by 90° to vertical, by a chip guide placed at a fixed position close to the outer periphery of the rotor, the chip guide including a continuously twisted guide face for making the sliding contact with the projecting portions of the electronic chips held in the cavities, wherein the guide face and upper surface of the base are initially co-planar to load the electronic chips.

23. An electronic chip feeding apparatus for changing the attitude of the electronic chip comprising:

a loading section for loading electronic chips onto a rotor in a first horizontal position;

a based for supporting the rotor;

a first attitude changing section for slidably changing the position of the electronic chip by 90° to a second vertical position, the electronic chip slidably changing from the first position to the second position with the rotation of the rotor via a continuously twisted guide face, wherein the guide face and an upper surface of the base are initially co-planar to load the electronic chips;

a working section; and a removal section for removing the electronic chips from the rotor.

24. An attitude changing apparatus for changing the attitude of an electronic chip, the apparatus comprising:

a rotor including cavities on the outer periphery of the rotor, the cavities contain and hold electronic chips vertically, wherein a part of the electronic chips projects over an outside portion of the rotor;

a base for supporting the rotor;

driving means for rotationally driving the rotor in a predetermined direction; and a chip guide placed at a fixed position close to the outer periphery of the rotor, the chip guide includes a continuously twisted guide face for making sliding contact with the projecting portions of the electronic chips held in the cavities so as to turn the attitudes of the electronic chips by 90° to horizontal, wherein the guide face and an upper surface of the base are initially co-planar to load the electronic chips.

25. A method for changing the attitude of an electronic chip, comprising the steps of:

placing an electronic chip vertically in cavities of a rotor which is supported on a base, the cavities located on the outer periphery of the rotor, wherein a part of the electronic chips projects over an outside portion of the rotor;

driving the rotor in a predetermined direction; and making sliding contact to turn the attitudes of the electronic chips by 90° to horizontal, by a chip guide placed at a fixed position close to the outer periphery of the rotor, the chip guide including a continuously twisted guide face for making the sliding contact with the projecting portions of the electronic chips held in the cavities, wherein the guide face and an upper surface of the base are initially co-planar to load the electronic chips.

26. An electronic chip feeding apparatus for changing the attitude of the electronic chip comprising:

a loading section for loading electronic chips onto a rotor in a first vertical position;

a base supporting the rotor;

a first attitude changing section for slidably changing the position of the electronic chip by 90° to a second position, the electronic chip slidably changing from the first position to the second horizontal position with the rotation of the rotor via a continuously twisted guide face, wherein the guide face and upper surface of the base are initially co-planar to load the electronic chips;

a working section; and a removal section for removing the electronic chips from the rotor.

* * * * *